United States Patent [19]

Sellers et al.

[11] Patent Number: 5,675,255
[45] Date of Patent: Oct. 7, 1997

[54] TESSERAL GRADIENT COIL FOR NUCLEAR MAGNETIC RESONANCE TOMOGRAPHY APPARATUS

[75] Inventors: Michael Sellers; Franz Boemmel, both of Erlangen, Germany

[73] Assignee: Siemens Aktiengesellschaft, Munich, Germany

[21] Appl. No.: 685,930

[22] Filed: Jul. 22, 1996

[30] Foreign Application Priority Data

Jul. 24, 1995 [DE] Germany .................. 195 27 020.7

[51] Int. Cl.⁶ .................................................. G01V 3/00
[52] U.S. Cl. .................................................. 324/318
[58] Field of Search ................................ 324/318, 322, 324/319, 314, 309, 307, 300; 128/653.5

[56] References Cited

U.S. PATENT DOCUMENTS

| | | | |
|---|---|---|---|
| 4,486,711 | 12/1984 | Frese et al. | 324/318 |
| 5,198,769 | 3/1993 | Frese et al. | 324/318 |
| 5,309,107 | 5/1994 | Pausch | 324/318 |
| 5,349,318 | 9/1994 | Inoue | 324/318 |
| 5,512,828 | 4/1996 | Pausch et al. | 324/309 |
| 5,561,371 | 10/1996 | Schenck | 324/318 |
| 5,563,567 | 10/1996 | Westphal | 324/318 |

FOREIGN PATENT DOCUMENTS 0 216 590  4/1987  European Pat. Off. .

*Primary Examiner*—Louis M. Arana
*Attorney, Agent, or Firm*—Hill, Steadman & Simpson

[57] ABSTRACT

A tesseral gradient coil is composed of at least two coil segments spaced in axial direction, each coil segment being composed of at least two windings symmetrically arranged relative to a middle line of an interior of the nuclear magnetic resonance apparatus. Each winding has an outer winding part, lying on a larger radius around the middle axis and an inner part lying on a smaller radius around the middle axis of the interior. The two winding parts are oppositely traversed by current. The number of ampere-turns of the outer winding part of each winding is lower than the number of ampere-turns of the inner winding part.

5 Claims, 11 Drawing Sheets

TESSERAL GRADIENT COIL FOR NUCLEAR MAGNETIC RESONANCE TOMOGRAPHY APPARATUS

BACKGROUND OF THE INVENTION

1. Field of the Invention

The invention is directed to a tesseral gradient coil for nuclear magnetic resonance tomography apparatus of the type which is arranged in a hollow-cylindrical interior of a basic field magnet for generating magnetic field gradients, each gradient coil being composed of at least two coil segments spaced in the axial direction, and each coil segment being composed of at least two windings arranged symmetrically relative to a middle line of the interior, and each winding being composed of an inner winding part lying on a smaller radius around the middle axis of the interior and of an outer winding part lying on a larger radius around the middle axis of the interior, the inner and outer winding parts having current flowing therein respectively in opposite directions.

2. Description of the Prior Art

A gradient coil of the above type is disclosed, for example, in U.S. Pat. No. 5,198,769.

In order to explain the objective of the present invention, a conventional gradient coil arrangement of the above type shall be explained in more detail with reference to FIGS. 1 through 3.

FIG. 1 shows components of a nuclear magnetic resonance tomography apparatus needed for explaining the invention in highly schematic form. In the exemplary embodiment of FIG. 1, the basic magnetic field is generated with a superconductive basic field magnet. The coils required therefor (not shown in FIG. 1) are arranged in a cylindrical cryostat 1. The cryostat 1 has a hollow-cylindrical interior 1b. A hollow-cylindrical carrier member 2 for gradient coils is arranged in this interior 16. A radiofrequency antenna that is formed by rods 3 in the exemplary embodiment is provided inside the carrier member 2. Further, a patient bed 4 is arranged inside the carrier member 2.

Further elements that are usually present in a nuclear magnetic resonance tomograph, for example shim devices, are not shown in FIG. 1 since they are not necessary for explaining the invention.

For explaining the objective, FIG. 2 schematically shows a known gradient coil system for generating a magnetic field gradient in the y-direction. Magnetic field gradients in three directions x,y and z residing perpendicular to one another according to the coordinate system shown in FIG. 2 are necessary in a nuclear magnetic resonance tomography apparatus. The direction of the basic magnetic field $B_z$, i.e. the longitudinal axis of the hollow-cylindrical interior 16, is thereby defined as the z-direction. The gradient coils serving to generate magnetic field gradients perpendicular to this z-axis are referred to as "tesseral" gradient coils.

The invention is only directed to tesseral gradient coils, so that the gradient coils serving to generate a magnetic field gradient in the z-direction, which can be simply executed as windings on the carrier member 2, have been omitted for clarity.

FIG. 2 only shows a conventional type of gradient coil system provided for generating a magnetic field gradient in the y-direction. This gradient coil system is composed of four individual saddle coils 5 through 8. The respective inner arcs 5a through 8a of the saddle coils 5 through 8 essentially contribute to generating the magnetic field gradient in the y-direction; the respective outer arcs 5b through 8b lie at a greater distance from the actual examination region 9. The effect of the inner arcs 5a through 8a on the magnetic field in the examination region is identified with arrows in FIG. 2. An intensification of the basic magnetic field $B_z$ is achieved in the upper part of the examination region 9 a weakening thereof is achieved in the lower region, so that a magnetic field gradient in the y-direction occurs.

In order to generate a magnetic field gradient in the x-direction, the same coil arrangement is present again, merely turned by 90° around the cylinder axis, but this has not been shown in FIG. 2 for clarity.

Although this gradient coil arrangement has the advantage that it can be built extremely flat, it produces a strong parasitic magnetic field component $B_p$ in the radial direction that is stronger than the usable magnetic field component in the z-direction. Given changes in current, this parasitic magnetic field $B_p$ induces currents in the inside wall of the cryostat and in the examination subject, to a greater extent than due to the useful field. These induced currents become more disruptive as the change in current becomes larger, and thus the flux change dB/dt, particularly given imaging according to the echo planar method, for example.

In order to reduce the currents induced in the inside wall of the cryostat, European Application 0 216 590 discloses a gradient coil be provided with an active shielding. Such an arrangement is schematically shown in FIG. 3. Two saddle coils 5 and 5a lie on two concentric cylindrical surfaces. The saddle coils 5 and 5a are oppositely traversed by current. The inner saddle coil 5 generates the useful field for the magnetic field gradient, whereas the saddle coil 5a compensates the magnetic field of the saddle coil 5 toward the outside. Such an arrangement, however, requires twice the number of coils, plus the outer saddle coil 5a also attenuates the useful field of the inner saddle coil 5.

In order to compensate the parasitic magnetic fields given gradient coils, U.S. Pat. No. 5,198,769, cited above, discloses that the tesseral gradient coils not be implemented as saddle coils, but instead be in the form of segments lying perpendicularly relative to the longitudinal axis of the examination space. FIG. 4 shows a corresponding exemplary embodiment. The coil axis of such a gradient coil now no longer extends in the radial direction, as in the embodiment of FIG. 2, but in the axial direction. The parasitic radial field component is significantly smaller. The risk of stimulations due to rapidly switched gradients and the currents thus induced in the patient is therefore clearly lower. Since gradient coils of this type enclose a very small area, they also only exhibit little inductance and small energy storage. The ohmic resistance of the windings also remains small because of the short line lengths. Lower demands are made of the gradient power supply as a result of these factors. The Lorentz forces are oppositely directed onto the inner and outer winding segments and compensate one another. Lower overall forces therefore arise in sum in the magnetic field, so that mechanical vibrations can be damped with structurally simple means. The noise caused by the gradient switching is thus also noticeably reduced.

Finally, the gradient coils with the individual segments can be built shorter than conventional saddle coils.

In a modification disclosed in the aforementioned United States patent, the above-described segments are combined with a conventional saddle coil. The segment coil in that version has only as many turns as are required for an optimum shielding effect.

Although the segmented gradient coil according to FIG. 4 already offers a certain shielding effect toward the inside wall of the cryostat, this design nonetheless exhibits disadvantages with respect to the active shielding compared to the conventional saddle coil:

- The segmented gradient coil has a greater structural height in the radial direction than conventional, actively shielded saddle coils since the optimum ratio of the radii of the outer winding part to the inner winding part is equal to $\sqrt{2}$, i.e. is about 1.414. A reduction of this ratio would noticeably degrade the usable linear image region. In a conventional, actively shielded saddle coil, the ratio of the radii of the inner coil to the outer coil typically lies at 1.24. Given the same inside diameter of the two gradient coil designs, the segmented gradient coil arrangement would therefore be 15% thicker, i.e. what is referred to as the warm bore of the magnet would have to be correspondingly enlarged, this involving substantial added costs. Given the same diameter of the warm bore, on the other hand, the available inside diameter, and thus the examination space as well, would be narrower, which is also highly undesirable.

- The shielding effect of the segmented gradient coil is not perfect, since the outer windings generate a field that is stronger than would be needed for the compensation. This is because the number of turns of the outer and of the inner winding parts are the same. Given a saddle coil, the ratio of the numbers of turns typically lies at 0.6:1 for an optimum shielding.

The field line pattern for a gradient coil design according to FIG. 4 given optimized spacing between the individual winding parts is shown in FIG. 5 for the x-y-plane, i.e. the plane perpendicular to the longitudinal axis of the magnetic field. It can be qualitatively derived from FIG. 5 that the gradient field proceeds linearly rather well in the region of a circular examination region 9 (i.e., the field lines proceed straight), but that a relatively great stray field occurs outside the coils.

FIG. 6 shows the field line pattern in the x-z-plane, i.e. in the longitudinal direction (z-direction) of the magnet axis. What is desired here is an adequate linearity within an ellipse 10. One can see from the curvature of the field lines within the ellipse 10 that this condition is only insufficiently met.

SUMMARY OF THE INVENTION

An object of the present invention is to fashion gradient coils for a nuclear magnetic resonance tomography apparatus such that the advantages of the saddle coil design as well as of the segmented design are obtained.

The above object is achieved in accordance with the principles of the present invention in a tesseral gradient coil for a nuclear magnetic resonance tomography apparatus which is arranged on a hollow-cylindrical interior of a basic field magnet for generating a magnetic field gradient, the tesseral gradient coil being composed of at least two coil segments spaced in the axial direction, each coil segment being composed of at least windings arranged symmetrically relative to a center line of the interior, each winding being composed of an inner winding part lying on a smaller radius around the center axis and an outer winding part lying on a larger radius around the center axis, the inner and outer winding parts respectively having current flowing therein in opposite directions, and the outer winding part being composed of a number of ampere-turns which is fewer than the number ampere-turns of the inner winding part.

DESCRIPTION OF THE PREFERRED EMBODIMENTS

Figure 1:
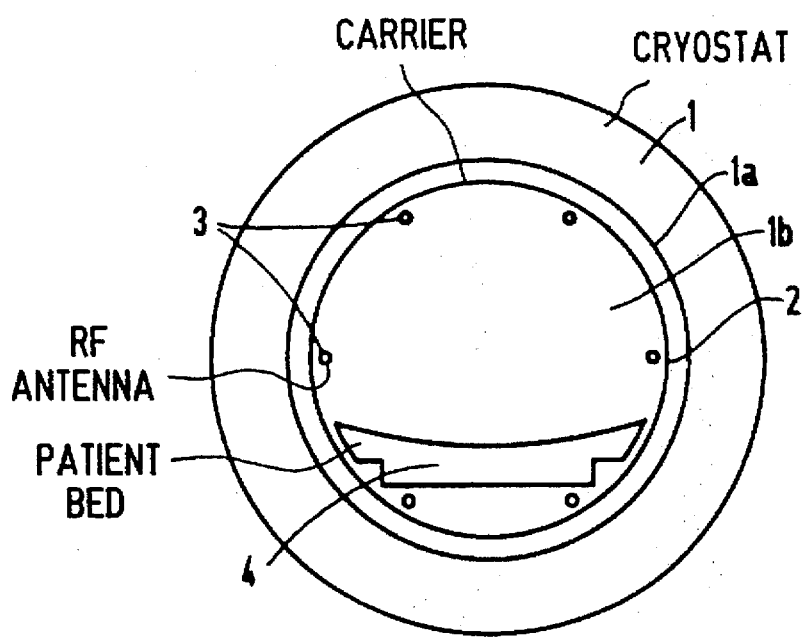
FIG. 1 is a schematic illustration of a nuclear magnetic resonance tomography apparatus of known construction.
Figure 2:
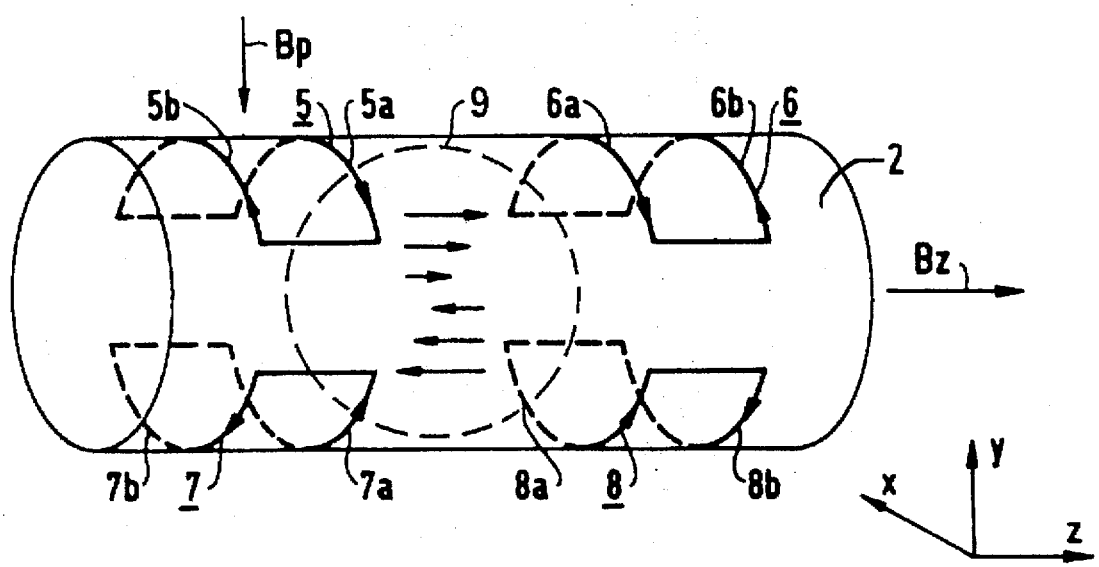
FIG. 2 shows a known gradient coil system for generating a magnetic field gradient in the small y-direction in the apparatus of FIG. 1.
Figure 3:
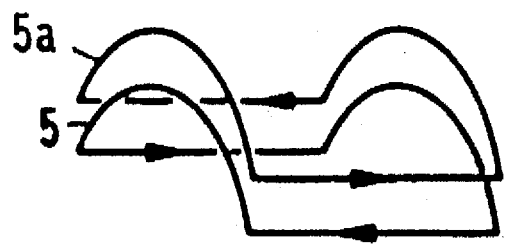
FIG. 3 shows a known arrangement for actively shielding a gradient coil, suitable for use in the apparatus of FIG. 1.
Figure 4:
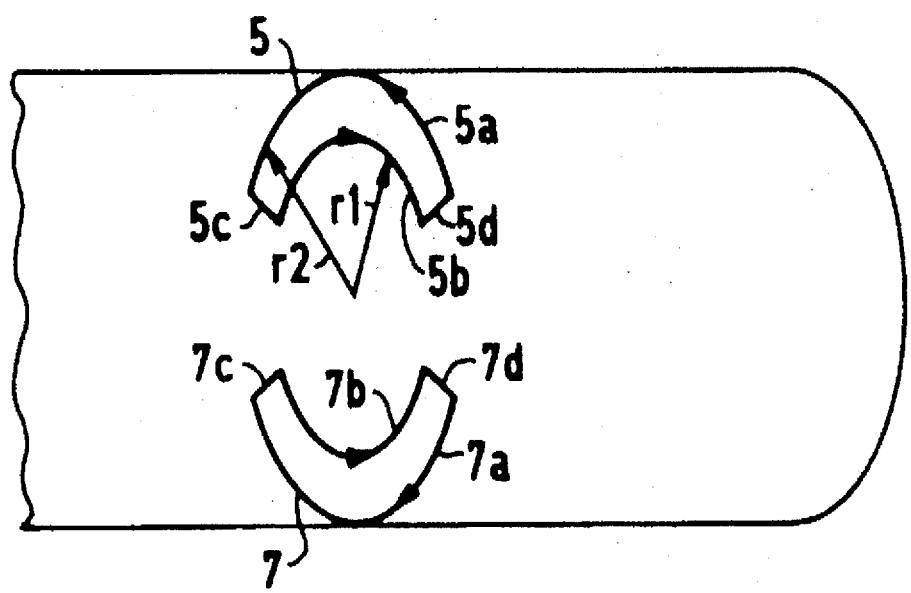
FIG. 4 shows a known arrangement for compensating for parasitic magnetic fields generated by a gradient coil for use in the apparatus of FIG. 1.
Figure 5:
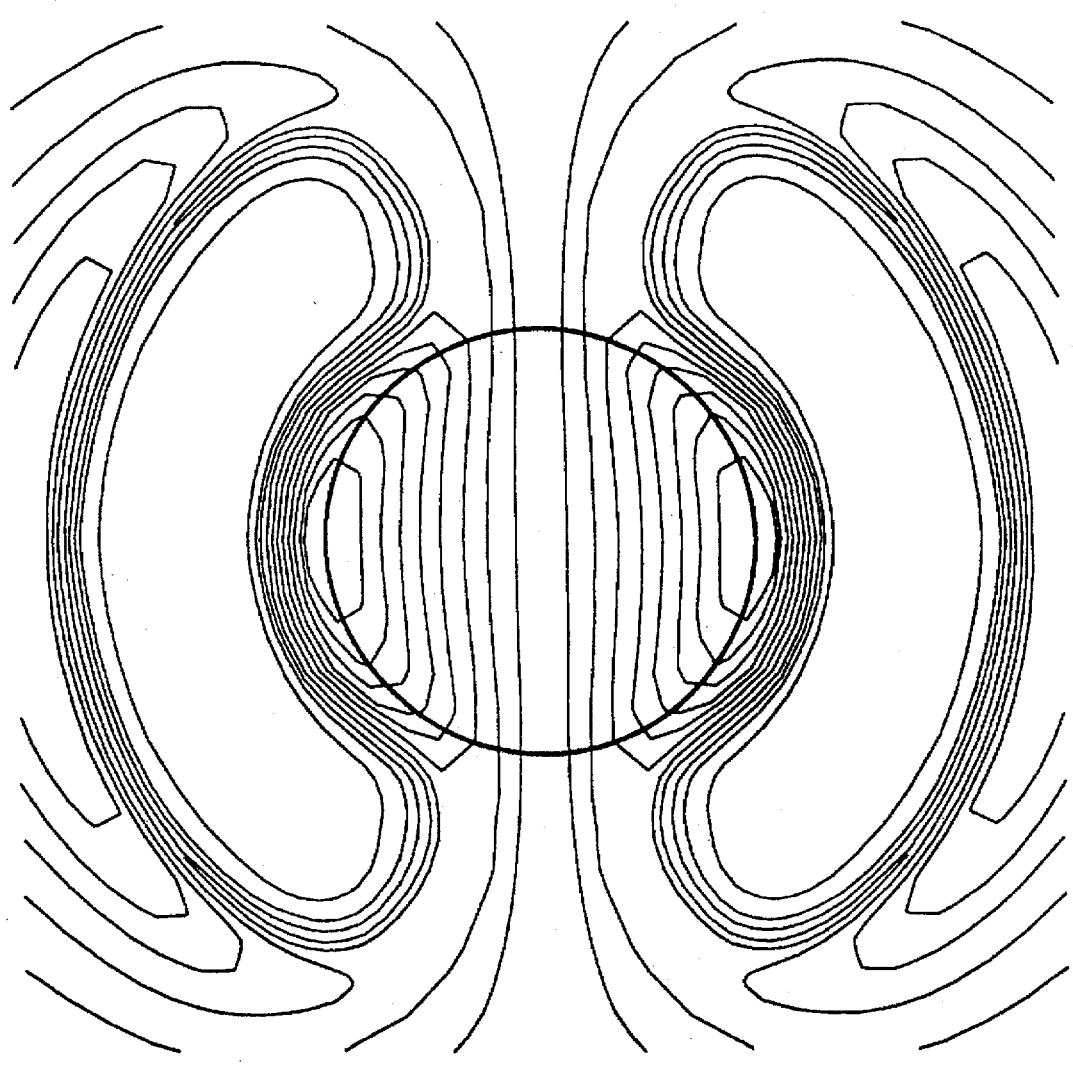
FIG. 5 shows the field pattern in the x-y-plane for the known coil design of FIG. 4.
Figure 6:
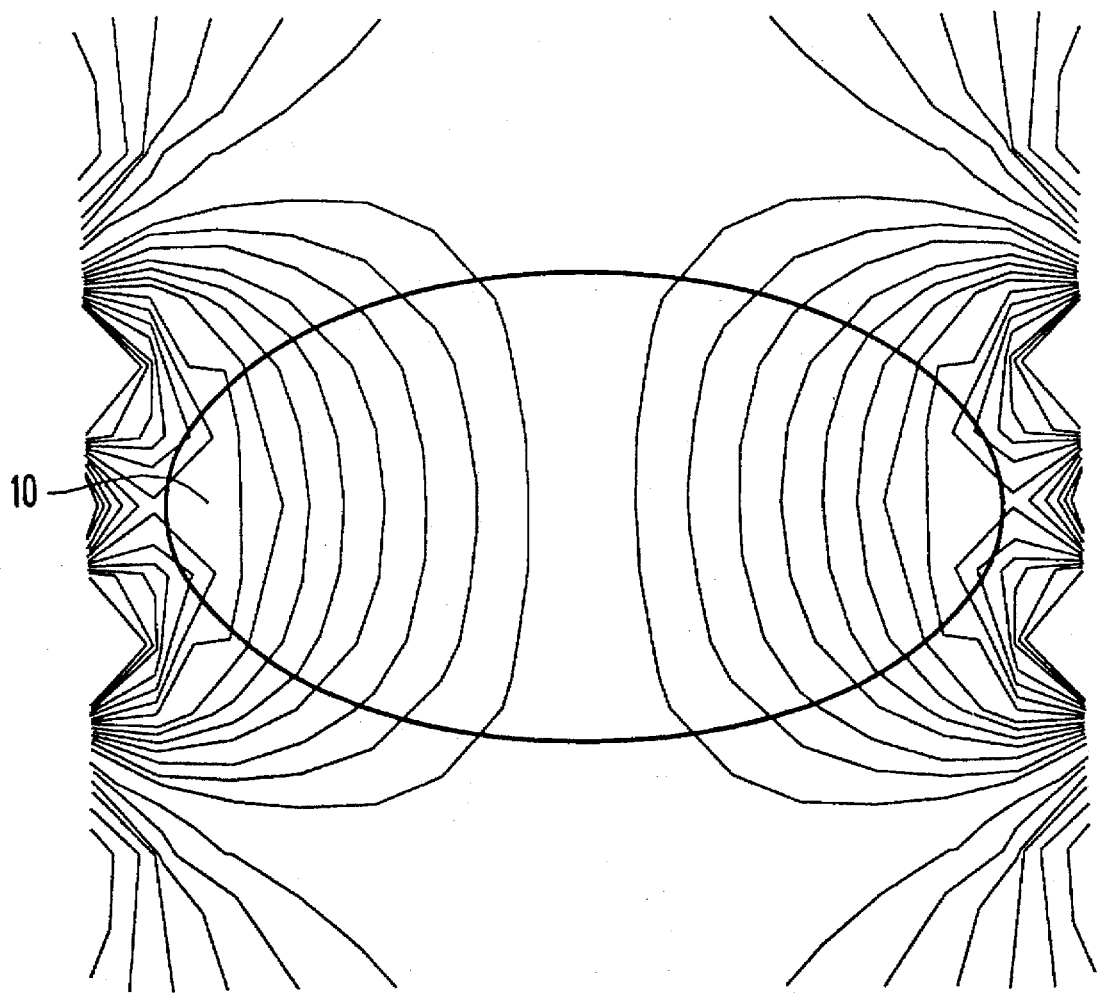
FIG. 6 shows the field pattern in the x-z-plane for the known coil design of FIG. 4.
Figure 7:
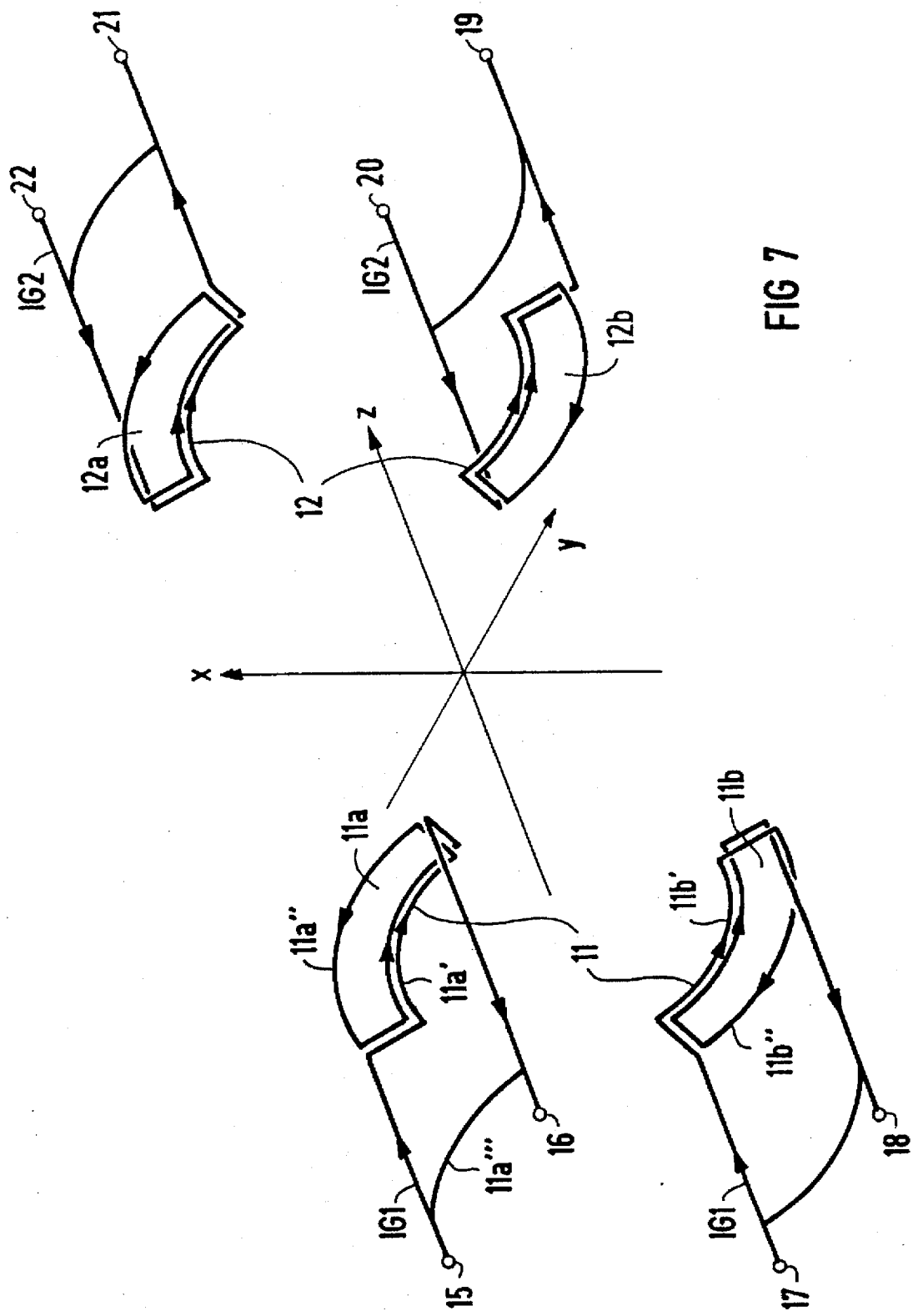
FIG. 7 shows a first exemplary embodiment of a gradient coil constructed in accordance with the principles of the present invention.

A segmented gradient coil for the x-direction is shown in the first exemplary embodiment of the invention according to FIG. 7. A coordinate system defining the respective directions is shown in FIG. 7. The y-gradient coil is not shown since it is constructed identically to the x-gradient coil and is merely turned by 90° around the longitudinal axis compared thereto. The z-gradient coil is also not shown since it can be constructed in a conventional way.

The gradient coil of FIG. 7 is composed of two coil segments 11 and 12 respectively having two windings 11a,11b and 12a,12b whose wound surfaces respectively lie in a surface perpendicular to the middle axis. In the exemplary embodiment, each winding 11a,11b,12a,12b has two terminal posts, respectively 15 through 22, via which respective gradient currents IG1 and IG2 are supplied in the direction shown in FIG. 7.

The current path is described below with reference to the example of the winding 11a. A current IG1 is supplied via a post 15, is then conducted in the clockwise direction over an inner arc 11a', returned via an outer arc 11a'', and is finally returned in the clockwise direction to the post 16 via the inner arc 11a'. The illustration is thus directed to only one turn. In practice, of course, each winding 11a through 12b is composed of many more turns. The current is then guided via conductors on the aforementioned path on a return arc 11a'''. The return arc 11a''' is at an optimally large distance from the center of the gradient system, i.e. from the examination volume, so that the gradient field in the examination volume is disturbed as little as possible by the conductors in the return arc 11a'''.

The three remaining windings 11b,12a,12b are constructed identically to the winding 11a; the direction of the current of the lower windings 11b,12b merely proceeds opposite to the direction of current of the upper windings 11a,12a so that the required magnetic field gradient is constructed in the x-direction.

Figure 8:
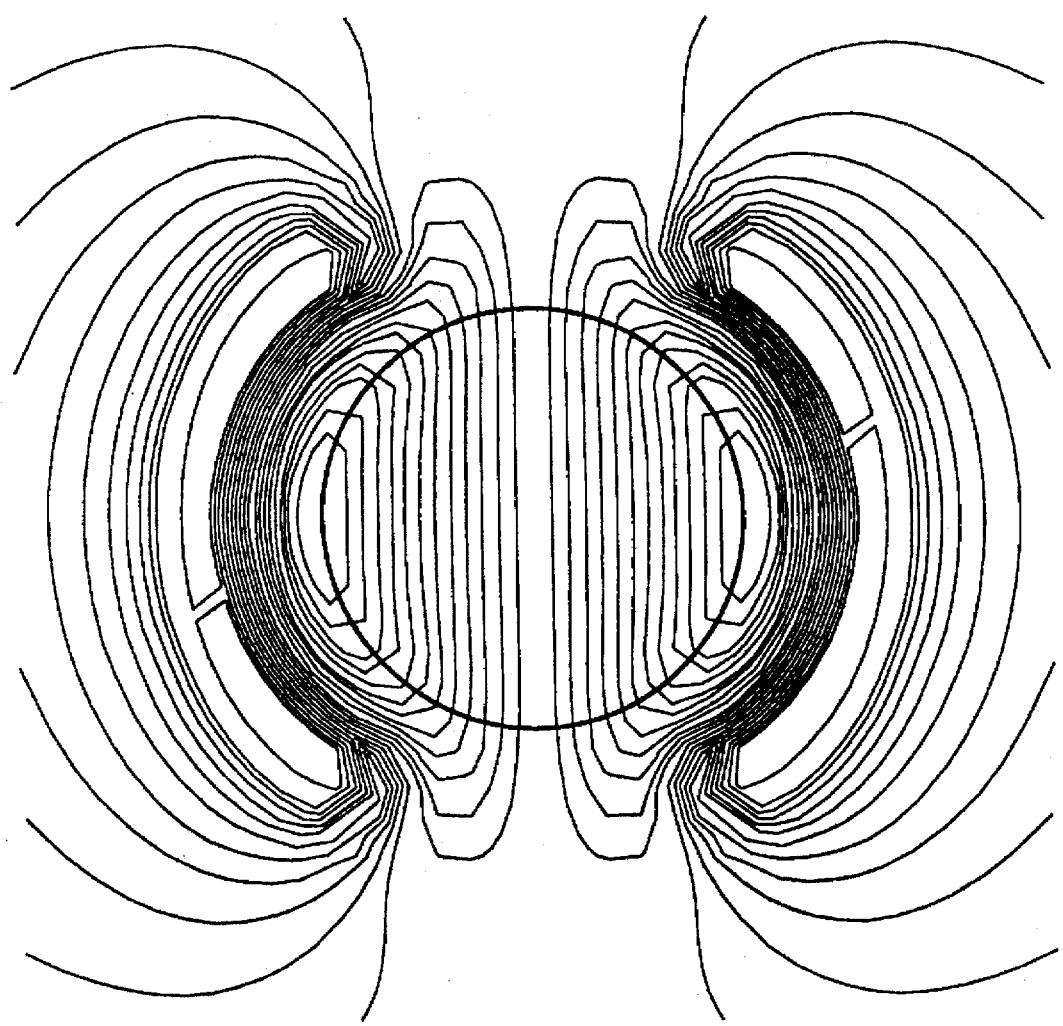
FIG. 8 shows the field pattern in the x-y-plane of the gradient coil of FIG. 7, for a ratio of outer to inner diameter of 0.2 m/0.175 m=1.14.
Figure 9:
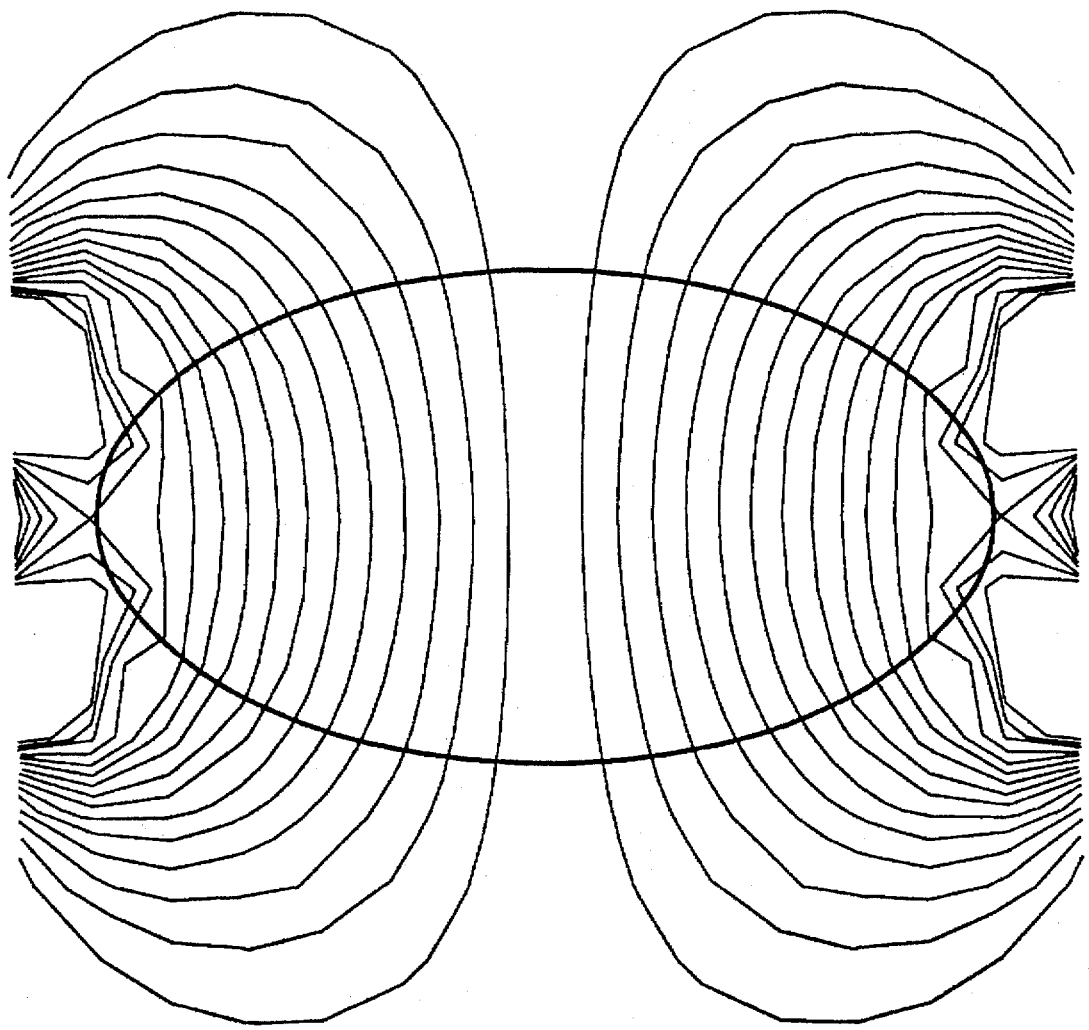
FIG. 9 shows the field pattern in the x-z-plane of the gradient coil of FIG. 7, for a ratio of outer to inner diameter of 0.2 m/0.175 m=1.14.

In each of the windings 11a through 12b, the inner winding parts 11a',11b',12a',12b' thus have twice the number of turns their associated outer winding parts. The number of turns on the outer winding parts thus approximately corresponds to the requirements for an active shielding, so that eddy currents are reduced compared to the known segment coil. Given an optimized spacing between the segments 11 and 12, a gradient strength of 2.13 mT/m given a number of ampere-turns of 100 on the inner winding parts and 50 on the outer winding parts. FIG. 8 shows the field course in an x-y-plane that proceeds through the middle of the examination volume 9. One can see that the field course is noticeably more uniform in the examination volume compared to the conventional arrangement and that the shielding effect is also significantly better. Further, the ratio of the diameters of the inner and outer winding parts now lies at 0.2/0.175=1.14. The radial expanse of the gradient coils is therefore significantly less than is the case for the conventional segment coil and is even better than for actively shielded saddle coils. Less space is thus used in the warm bore of the magnet, so that a larger examination space is obtained given the same size warm bore, or the warm bore of the magnet can be made smaller given the same examination space.

The disclosed design largely unites the advantages of a pure segment coil and of a saddle coil:

The Lorentz forces in fact no longer exactly compensate, so that the gradient coil is subjected to a resultant force. By contrast to saddle coils, however, no bending moment occurs, and it is the bending moment which represents the principal source for the creation of noise.

The gradient coils become shorter than saddle coils, as in the case of conventional segment coils.

The inductance and the ohmic resistance are noticeably reduced, even though to a lesser extent than for the conventional segment coil.

The physiological stimulation is reduced since a $B_{xy}$-component is produced only by the conductor sections that proceed parallel to the z-axis. Compared to the useful turns on the inner radius, however, these have only half the number of ampere-turns and lead away from the examination volume.

On the basis of initial investigations, one can assume an equivalent linearity. In these investigations, the linearity was optimized only in view of the spacing between the segments. The optimization of further parameters, for example the ratio between the diameter of outer and inner winding parts, could yield further improvement.

The ratio of the diameters of outer to inner winding parts is smaller compared to conventional segment coils as well as to saddle coils. Given an unaltered warm bore of the magnet, there is thus more space for the patient, for radiofrequency coils, etc.

The active shielding effect should be adequate for avoiding eddy currents in the cryostat. The shielding factor can be determined by optimizing the diameters of outer and inner winding parts.

The manufacturability is clearly simplified. Each segment can be simply wound on a flat disk form. The individual segments then simply have to be assembled.

Figure 10:
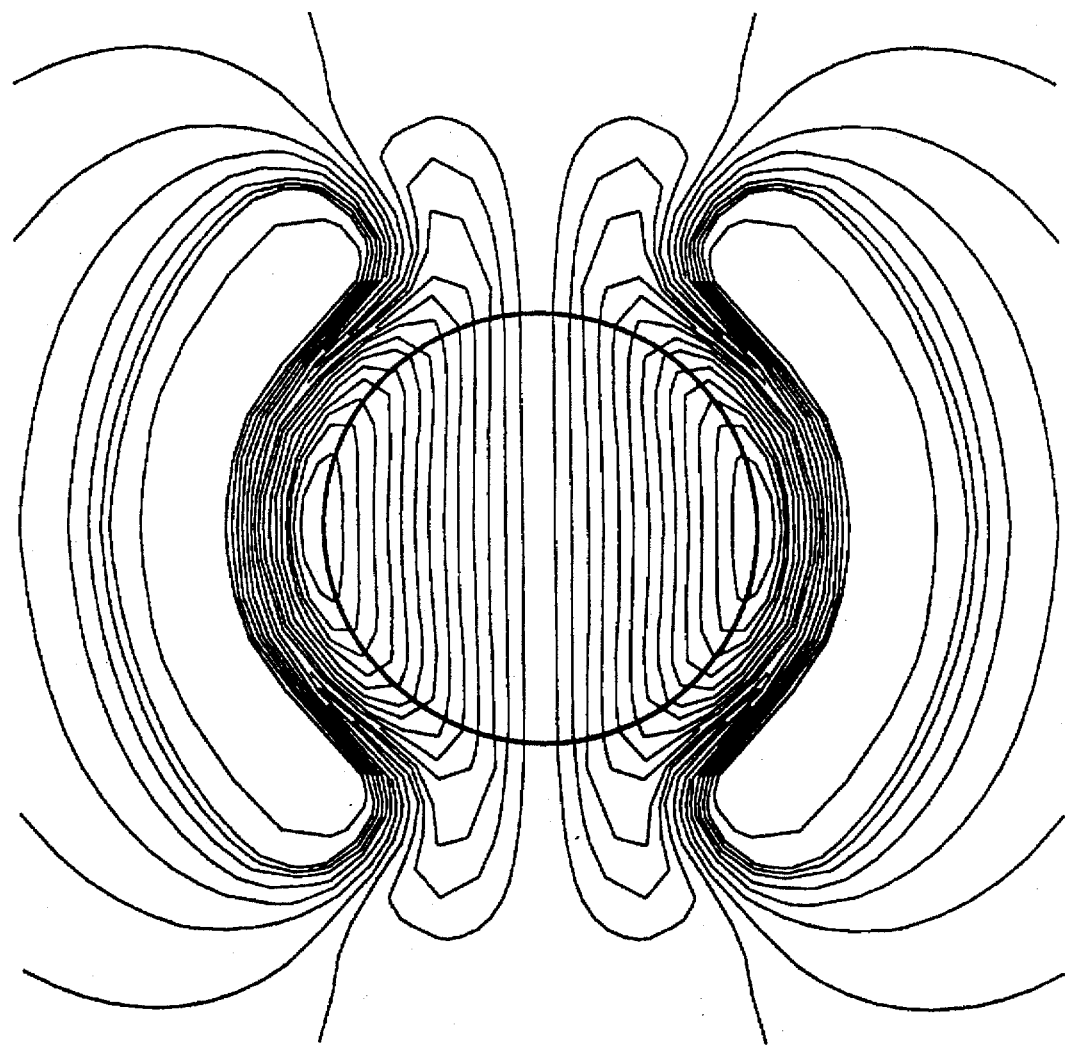
FIG. 10 shows the field pattern in the x-y-plane of the gradient coil of FIG. 7, for a ratio of outer to inner diameter of 0.22 m/0.175 m=1.24.
Figure 11:
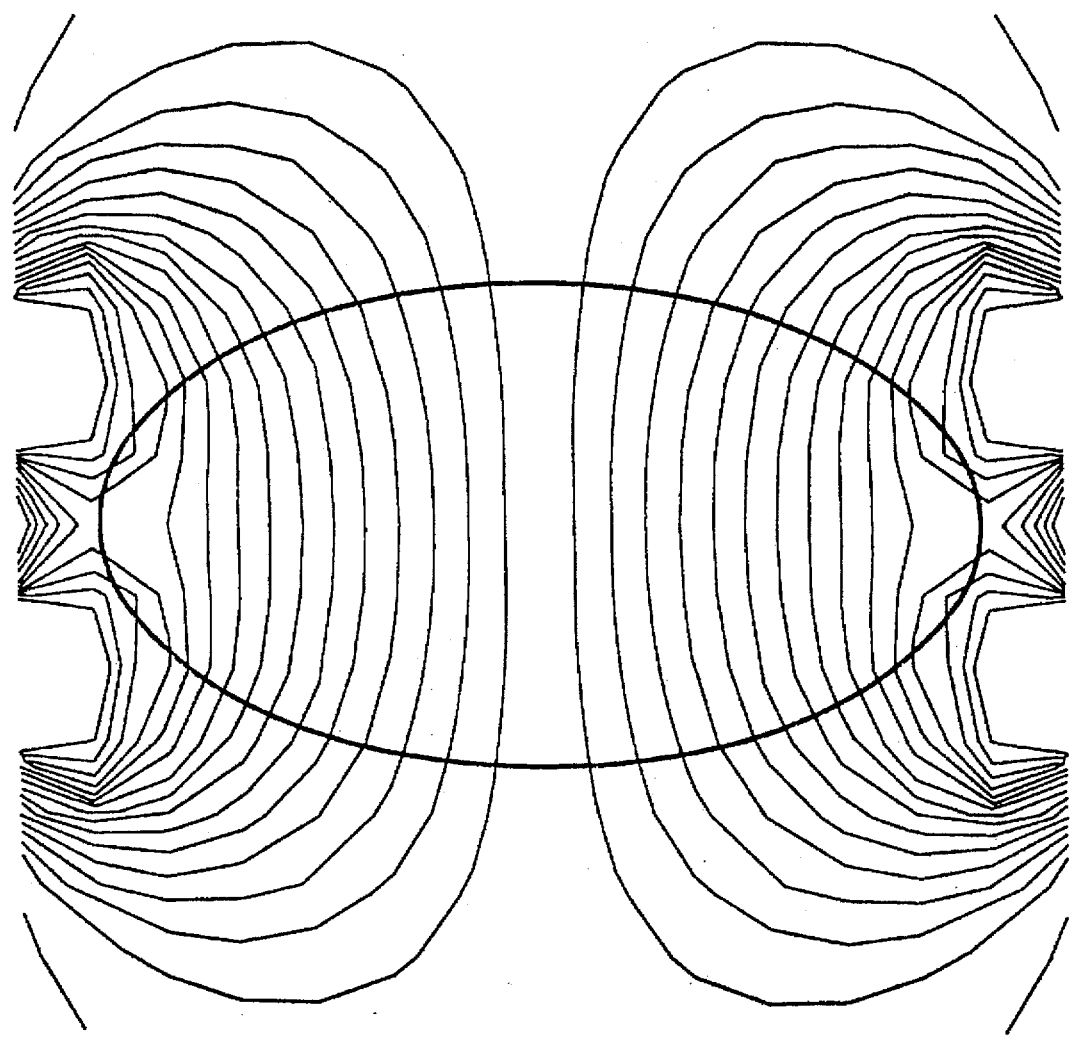
FIG. 11 shows the field pattern in the x-z-plane of the gradient coil of FIG. 7, for a ratio of outer to inner diameter of 0.22 m/0.175 m=1.24.

For comparative purposes, the field pattern of a gradient coil according to the inventive principle was also modeled for an outside radius of 0.22 m and an inside radius of 0.175, i.e. a ratio of 1.24. The corresponding field curves are shown in FIGS. 10 and 11. The field uniformity as well as the shielding effect were improved.

Figure 12:
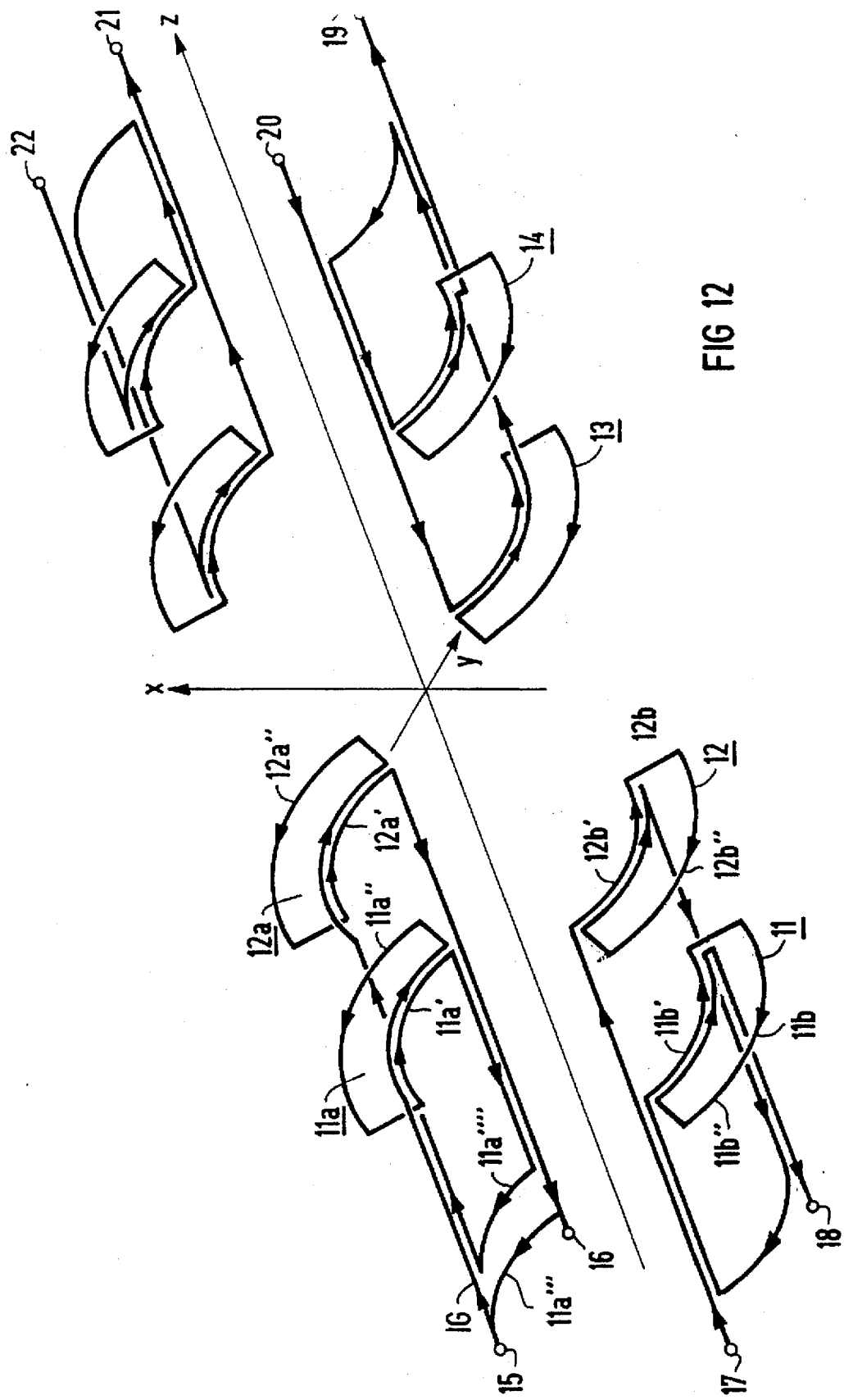
FIG. 12 shows an exemplary embodiment of a gradient coil constructed in accordance with the principles of the present invention, having four segments.

A linearity that is improved further can be achieved when the tesseral gradient coils are composed not of two segments, as hitherto shown, but of four segments. A corresponding, first exemplary embodiment of the four coil version of the invention is shown in FIG. 12. The respective current paths for upper windings 11a,12a of the segments 11 and 12 are explained below. The current path for the other windings proceeds correspondingly.

Figure 13:
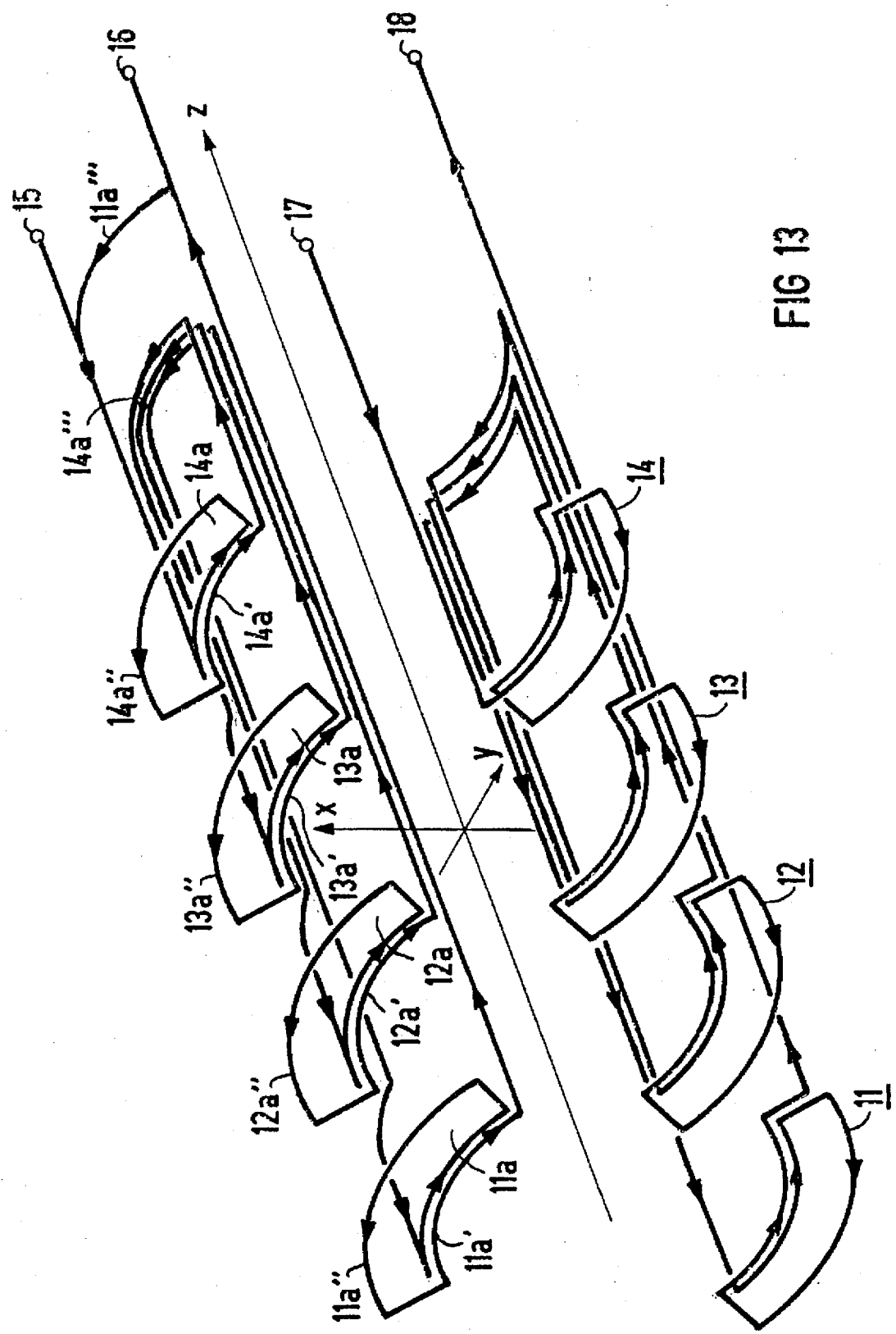
FIG. 13 shows a further exemplary embodiment of the inventive gradient coil having four segments, with all terminals being conducted out at one side of the magnet.

The gradient current IG is supplied via a terminal post 15 and first proceeds clockwise on an inner arc 11a' of the winding 11a, then in the opposite direction on an outer arc 11a'', and, finally, is guided in the clockwise direction again on the inner arc 11a'. Subsequently, the current is guided counter-clockwise via a return arc 11a'''' at a greater distance from the examination region 9 and then proceeds clockwise via an inner arc 12a' of the winding 12a, back on an outer arc 12a'' and back again to a terminal post 16 in the clockwise direction on the inner arc 12a'. This illustration is again directed to only one turn. Given the number of turns present in practice, these are closed via return arcs 11a'''. In this exemplary embodiment, the terminals for a respective winding pair are conducted out separately. Given a corresponding optimization of the spacing of the segments, the linearity can be improved with this arrangement, or the examination space can be enlarged with a given linearity. Given 100 ampere-turns, further, a higher gradient field strength is achieved, namely 2.47 mT/m. Another exemplary embodiment of a tesseral gradient coil with four segments is shown in FIG. 13. All terminal posts 15 through 18 are thereby conducted out at one side of the gradient coil. This is of particular significance for what are referred to as "insert" gradient coils, i.e. gradient coils that are not permanently built into the nuclear magnetic resonance tomography apparatus but, adapted to the examination apparatus like local radiofrequency coils, are inserted into the nuclear magnetic resonance tomography apparatus as needed. The current path for a turn in this embodiment is as follows.

Feed is via a first terminal post 15, the current then flowing via inner arc 14a' of the winding 14a in clockwise direction, return via the outer arc 14a'', inner arc 14a', again clockwise, and via return arc 14a''' in the counter-clockwise direction. The current flow continues via inner arc 13a' of the winding 13a in the clockwise direction, return via the outer arc 13a'', inner arc 13a', again clockwise. The flow returns via arc 14a''' in the counter-clockwise direction, flows via inner arc 12a' of the winding 12a in the clockwise direction and returns via the outer arc 12a''. Flow continues via inner arc 12a', again clockwise, return arc 14a''' in the counter-clockwise direction, inner arc 11a' of the winding 11a in the clockwise direction, return via the outer arc 11a'', inner arc 11a', again clockwise, finally returning to the post 16.

It must be emphasized that only one turn has again been shown; in practice, a number of turns with an additional return arc 11a''' are used.

In the illustrated exemplary embodiments, the inner winding parts have twice as many turns as the outer winding parts. Of course, it is also possible to select other ratios of these numbers of turns when the gradient coil is optimized according to eddy current behavior and/or Lorentz forces and/or linearity, etc.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a tesseral gradient coil for a nuclear magnetic resonance tomography apparatus, said apparatus having a basic field magnet with a hollow-cylindrical interior on which said tesseral gradient coil is disposed for generating a magnetic field gradient, said tesseral gradient coil comprising a segmented coil including at least two coil segments spaced in an axial direction, each coil segment being composed of at least two windings arranged symmetrically in a plane oriented perpendicularly relative to a center line of said interior, each winding being composed of an inner winding part laying on a smaller radius around said center axis and an outer winding part lying on a larger radius around said center axis and an outer winding part lying on a larger radius around said center axis, said inner and outer winding parts respectively having current flowing therein in opposite directions, the improvement comprising:

said outer winding part being composed of a first plurality of ampere-turns and said inner winding part being composed of a second plurality of ampere turns, said first plurality being less than said second plurality.

2. The improvement of claim 1 wherein a ratio of said first and second pluralities is selected for optimizing a shielding effect of said gradient coil.

3. The improvement of claim 1 wherein each tesseral gradient coil is composed of two segment pairs symmetrically arranged relative to a center point of an examination volume inside said interior, each segment pair including a first segment and a second segment and a return arc disposed at a distance from, said examination volume connecting the first segment of the inner winding part and the second segment of the inner winding part, and each segment pair having first and second terminal posts with said current being supplied to said first terminal post and being conducted through each segment pair in a sequence through said first segment of said inner winding part, said first segment of said outer winding part, said first segment of said inner winding part, said return arc, said second segment of said inner part, said second segment of said outer winding part, and said second segment of said inner winding part to said second terminal post.

4. The improvement of claim 1 wherein said tesseral gradient coil is composed of a plurality of N segments, including at least a first segment, a second segment and an $N^{th}$ segment and said gradient coil having a return arc disposed at a distance from said examination volume, and said gradient coil having common terminal posts for the windings corresponding to each other in each segment, including a first terminal post to which current is supplied and a second terminal post, and the current being conducted in a current path through said first segment of said inner winding part, said first segment of said outer winding part, said first segment of said inner winding part, said return arc, said second segment of said inner winding part, said second segment of said outer winding part, said second segment of said inner winding part, said return arc, said $N^{th}$ segment of said inner winding part, said $N^{th}$ segment of said outer winding part and said $N^{th}$ segment of said inner winding part to said second terminal post.

5. The improvement of claim 4 wherein all of said terminal posts are conducted out at a single side of said gradient coil.

* * * * *